(12) United States Patent
Swaminathan et al.

(10) Patent No.: US 10,450,670 B2
(45) Date of Patent: Oct. 22, 2019

(54) METHODS FOR GROWING A CRYSTAL INGOT WITH REDUCED DISLOCATIONS FROM A CRUCIBLE

(71) Applicant: Corner Star Limited, Kowloon (HK)

(72) Inventors: Tirumani N. Swaminathan, Creve Coeur, MO (US); Salvador Zepeda, St. Peters, MO (US); John David Hilker, St. Charles, MO (US)

(73) Assignee: Corner Star Limited, Kowloon (HK)

( * ) Notice: Subject to any disclaimer, the term of this patent is extended or adjusted under 35 U.S.C. 154(b) by 0 days.

(21) Appl. No.: 15/827,516

(22) Filed: Nov. 30, 2017

(65) Prior Publication Data

US 2018/0080141 A1 Mar. 22, 2018

Related U.S. Application Data

(63) Continuation of application No. 13/804,585, filed on Mar. 14, 2013, now Pat. No. 9,863,062.

(51) Int. Cl.
*C30B 15/12* (2006.01)
*C30B 15/00* (2006.01)
*C30B 29/06* (2006.01)

(52) U.S. Cl.
CPC ............ *C30B 15/12* (2013.01); *C30B 15/002* (2013.01); *C30B 29/06* (2013.01); *Y10T 117/1052* (2015.01)

(58) Field of Classification Search
CPC ....... C30B 15/002; C30B 15/02; C30B 15/12; C30B 15/20
See application file for complete search history.

(56) References Cited

U.S. PATENT DOCUMENTS

| 4,246,064 A | 1/1981 | Dewees et al. |
| 4,894,206 A | 1/1990 | Yamashita et al. |
| 5,021,225 A | 6/1991 | Yamashita et al. |
| 5,073,229 A | 12/1991 | Yamashita et al. |
| 5,126,114 A | 6/1992 | Kamio et al. |
| 5,139,750 A | 8/1992 | Shima et al. |

(Continued)

FOREIGN PATENT DOCUMENTS

| EP | 0261498 A2 | 3/1988 |
| EP | 0530825 A1 | 3/1993 |

(Continued)

OTHER PUBLICATIONS

Shimamura, Kiyoshi et al., A new crystal growth method for in situ core doping, Journal of Crystal Growth, Sep. 2, 1994, pp. 400-402, vol. 142, No. 3-4, Elsevier, Amsterdam, Neitherland.

(Continued)

*Primary Examiner* — Robert M Kunemund
(74) *Attorney, Agent, or Firm* — Armstrong Teasdale LLP (57) ABSTRACT

Methods for growing a reduced dislocation crystal ingot in an ingot growing system are disclosed. The system has a first crucible with a first base and a first sidewall extending upward from the first base to define an outer cavity. The method includes placing a weir in the outer cavity, placing a second crucible on the weir, placing feedstock material into the outer cavity, and melting the feedstock material to allow movement of the melt from the outer cavity inward of an intermediate cavity and into an inner cavity.

20 Claims, 10 Drawing Sheets

(56) References Cited

U.S. PATENT DOCUMENTS

| | | | |
|---|---|---|---|
| 5,143,704 | A | 9/1992 | Nakaham et al. |
| 5,279,798 | A | 1/1994 | Keneto et al. |
| 5,284,631 | A | 2/1994 | Kaneto et al. |
| 5,720,810 | A | 2/1998 | Arai et al. |
| 5,879,449 | A | 3/1999 | Beswick |
| 6,077,345 | A * | 6/2000 | Easoz .................. C30B 15/02 117/14 |
| 6,984,263 | B2 | 1/2006 | Wang et al. |
| 8,262,797 | B1 | 9/2012 | Bender et al. |
| 8,317,919 | B2 | 11/2012 | Bender |
| 2010/0031440 | A1 | 2/2010 | Harrow |

FOREIGN PATENT DOCUMENTS

| | | |
|---|---|---|
| JP | S4910664 A | 1/1974 |
| JP | H01317189 A | 12/1989 |
| JP | H03199192 A | 8/1991 |
| JP | H046198 A | 1/1992 |
| JP | H05310495 A | 11/1993 |
| JP | H06135791 A | 5/1994 |
| JP | 2007331998 A | 12/2007 |
| WO | 9117289 A1 | 11/1991 |

OTHER PUBLICATIONS

Jafri, I. H. et al., "Role of Crucible Partition in Improving Czochralski Melt Conditions," Journal of Crystal Growth, vol. 154, 1995, pp. 280-292.

Wang, C., et al., "A Continuous Czochralski Silicon Crystal Growth System," Journal of Crystal Growth, vol. 252, 2003, pp. 209-214.

International Search Report and Written Opinion of the International Search Authority regarding PCT/US2014/025388 dated Jun. 18, 2014, 16 pgs.

International Search Report and Written Opinion of the International Search Authority regarding PCT/US2014/027981 dated Sep. 30, 2014, 22 pgs.

* cited by examiner

METHODS FOR GROWING A CRYSTAL INGOT WITH REDUCED DISLOCATIONS FROM A CRUCIBLE

CROSS-REFERENCE TO RELATED APPLICATIONS

This application is a continuation of U.S. patent application Ser. No. 13/804,585, filed Mar. 14, 2013 now U.S. Pat. No. 9,863,062, which is incorporated herein by reference in its entirety.

FIELD

This disclosure generally relates to systems and methods for the production of ingots of semiconductor or solar material and more particularly to systems and methods for reducing dislocations in the ingot by limiting or inhibiting movement within a silicon melt.

BACKGROUND

In the production of single silicon crystals grown by the Czochralski (CZ) method, polycrystalline silicon is first melted within a crucible, such as a quartz crucible, of a crystal pulling device to form a silicon melt. The puller then lowers a seed crystal into the melt and slowly raises the seed crystal out of the melt. To produce a single high quality crystal using this method, the temperature and the stability of the surface of the melt immediately adjacent to the ingot must be maintained substantially constant. Prior systems for accomplishing this goal have not been completely satisfactory. Thus, there exists a need for a more efficient and effective system and method to limit temperature fluctuation and surface disruptions in the melt immediately adjacent to the ingot.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

A first aspect is a system for growing an ingot from a melt. The system includes a first crucible, a second crucible, and a weir. The first crucible has a first base and a first sidewall that form an outer cavity for containing the melt. The weir located on top of the first base at a location inward from the first sidewall to inhibit movement of the melt from a location outward of the weir to a location inward of the weir. The second crucible is sized for placement within the outer cavity and has a second base and a second sidewall that form an inner cavity. The second base is held in spaced relation to the first base by the weir. The second crucible has a crucible passageway therethrough to allow the melt located within the weir to move into the inner cavity of the second crucible.

Another aspect is a system for growing an ingot from a melt. The system includes a first crucible, a second crucible, and a weir. The first crucible has a first base and a first sidewall that form an outer cavity for containing the melt. The second crucible is located within the outer cavity of the first crucible and includes a second base and a second sidewall. The second sidewall is sized for placement within the outer cavity of the first crucible. The second base and the second sidewall form an inner cavity. The second base includes a crucible passageway therethrough to allow portions of the melt in an area outward of the second crucible to move into the inner cavity of the second crucible.

The weir is located within the outer cavity of the first crucible to inhibit movement of the melt from a location outward of the weir to a location inward of the weir. The weir is positioned between the first base and the second base to space the second base from the first base.

Another aspect is a method for growing an ingot from a melt in an ingot growing system. The system has a first crucible with a first base and a first sidewall extending upward from the first base to define an outer cavity. The method includes placing a weir in the outer cavity, placing a second crucible on the weir, placing feedstock material into the outer cavity, and melting the feedstock material.

The weir is placed along the first base to inhibit movement of the melt from a location outward of the weir to a location inward of the weir. The second crucible has a second base and a second sidewall that forms an outer cavity. The second base has a crucible extending therethrough. An intermediate cavity is formed inward of the weir, between the first crucible and the second crucible. The melting feedstock material forms the melt and moves from the outer cavity, inward of the intermediate cavity, and into the inner cavity.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

Corresponding reference characters indicate corresponding parts throughout the several views of the drawings.

DETAILED DESCRIPTION

Typically, weirs are quartz pipes that are placed within a crucible to limit the movement of the melt. In many instances, the bottoms of the weirs do not form perfect barriers to prevent the flow of the melt. As a result, unliquefied or solid particles of feedstock material pass through small gaps between the bottom of the weirs and the crucible. The passageway of the solid particle into an area adjacent to a forming crystal ingot greatly increases the risk of the ingot being hit and having its crystalline structure disrupted (sometimes called loss-of-structure or LOS.)

In a crystal growing system using a continuous Czochralski process, one or more silica weirs are located between an outer or first crucible and an inner or second crucible to form a crucible assembly. The second crucible is supported by the one or more weir(s) that are submerged within the melt. These weir(s) create multiple zones within the crucible assembly to limit the melt within one zone from passing into another zone to specific locations.

Figure 1:
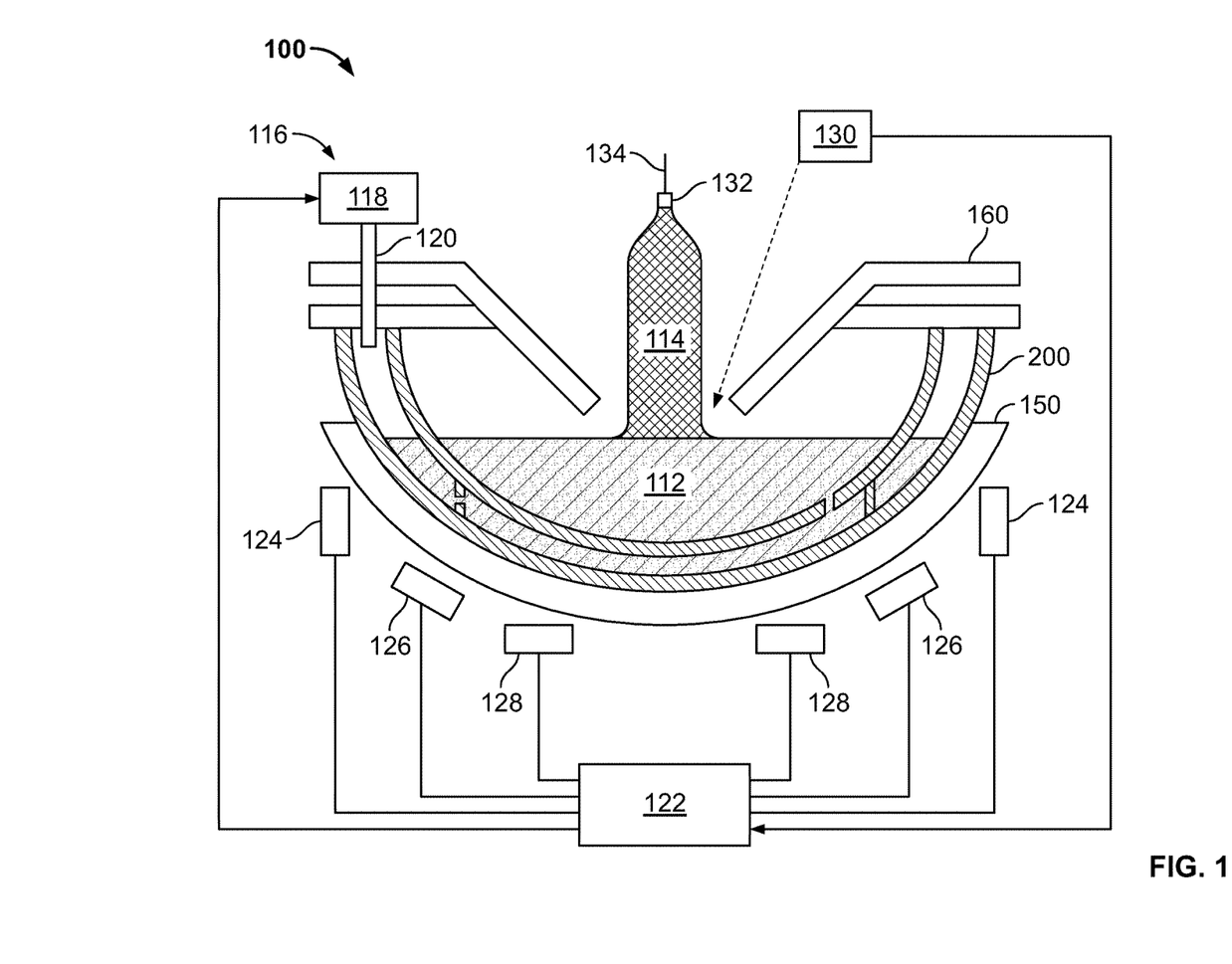
FIG. 1 is a side cross sectional view of a crystal growing system in accordance with one embodiment.

Referring to FIG. 1, a crystal growing system is shown schematically and is indicated generally at 100. The crystal growing system 100 is used to produce a single crystal ingot by a Czochralski method. As discussed herein, the system is described in relation to the continuous Czochralski method of producing single crystal ingots, though a batch process may be used. For example, the process may be used in a "recharge" CZ process.

The crystal growing system 100 includes a susceptor 150 supporting a crucible assembly 200 that contains a silicon melt 112 from which an ingot 114 is being pulled by a puller 134. During the crystal pulling process, a seed crystal 132 is lowered by the puller 134 into the melt 112 and then slowly raised from the melt. As seed crystal 132 is slowly raised from melt 112, silicon atoms from the melt align themselves with and attach to the seed crystal to form the ingot 114.

Figure 2:
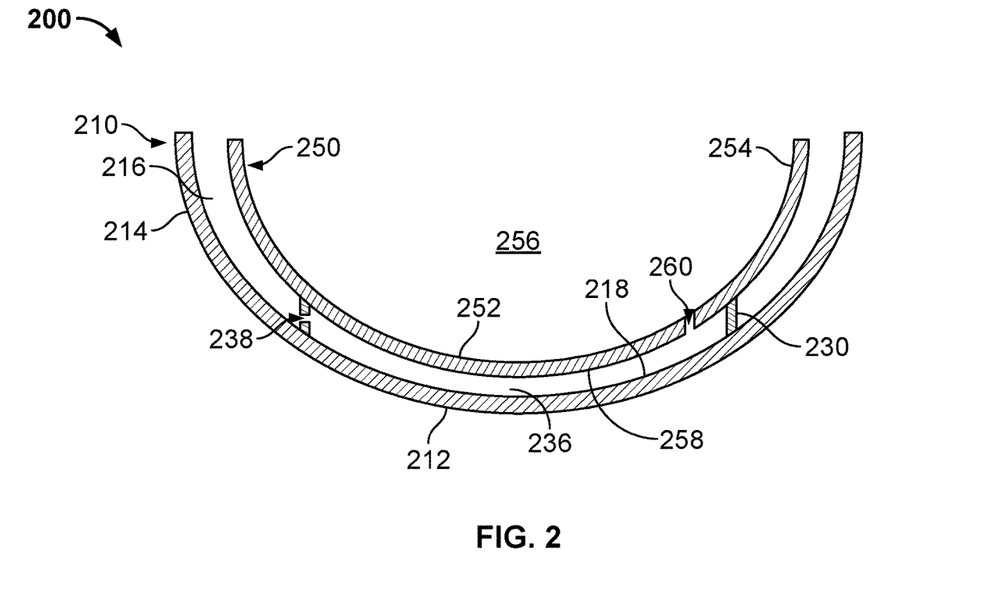
FIG. 2 is an enlarged cross-sectional view of a crucible assembly of FIG. 1.

With additional reference to FIG. 2, the crucible assembly 200 includes a first crucible 210 having a first base 212 and a first sidewall 214, a weir 230, and a second crucible 250 having a second base 252 and a second sidewall 254. The first base 212 has a top surface 218 and the second base 252 has a bottom surface 258.

Each sidewall 214, 254 extends around the circumference of the respective base 212, 252. The first sidewall 214 and the first base 212 form an outer cavity 216. The second sidewall 254 and the second base 252 form an inner cavity 256. The second crucible 250 is sized and shaped to allow placement of the second crucible within the outer cavity 216 of the first crucible 210. In some embodiments, the first crucible may have an internal radius of 32-inches and the second crucible may have an internal radius of 24-inches.

Figure 3:
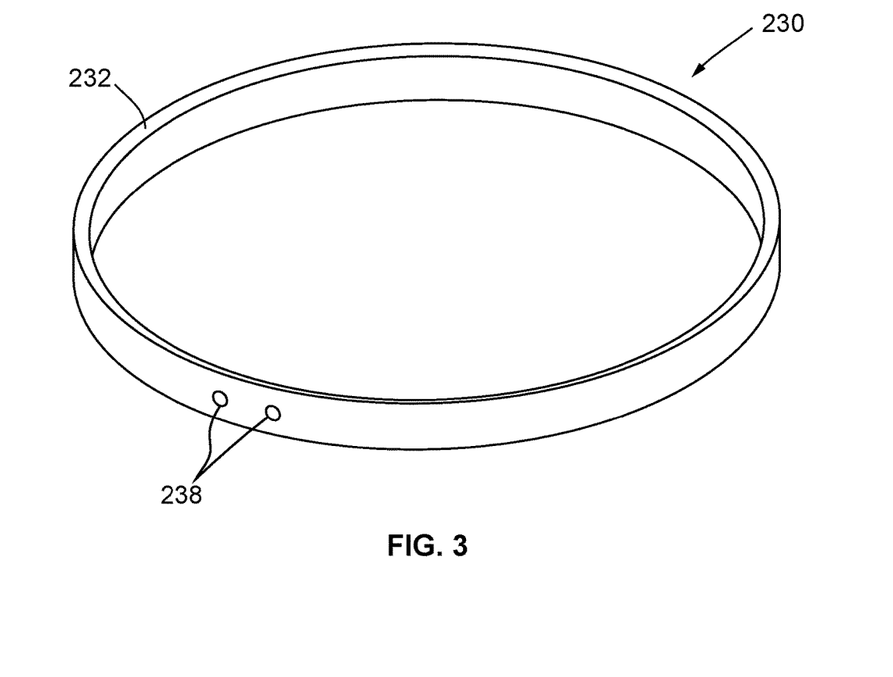
FIG. 3 is a top perspective view of a weir used in the crystal growing system of FIG. 1.
Figure 4:
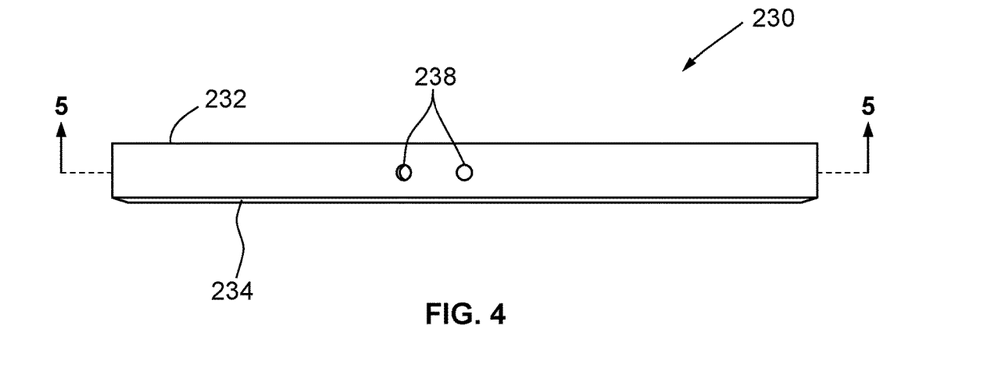
FIG. 4 is a side elevation of the weir of FIG. 3.
Figure 5:
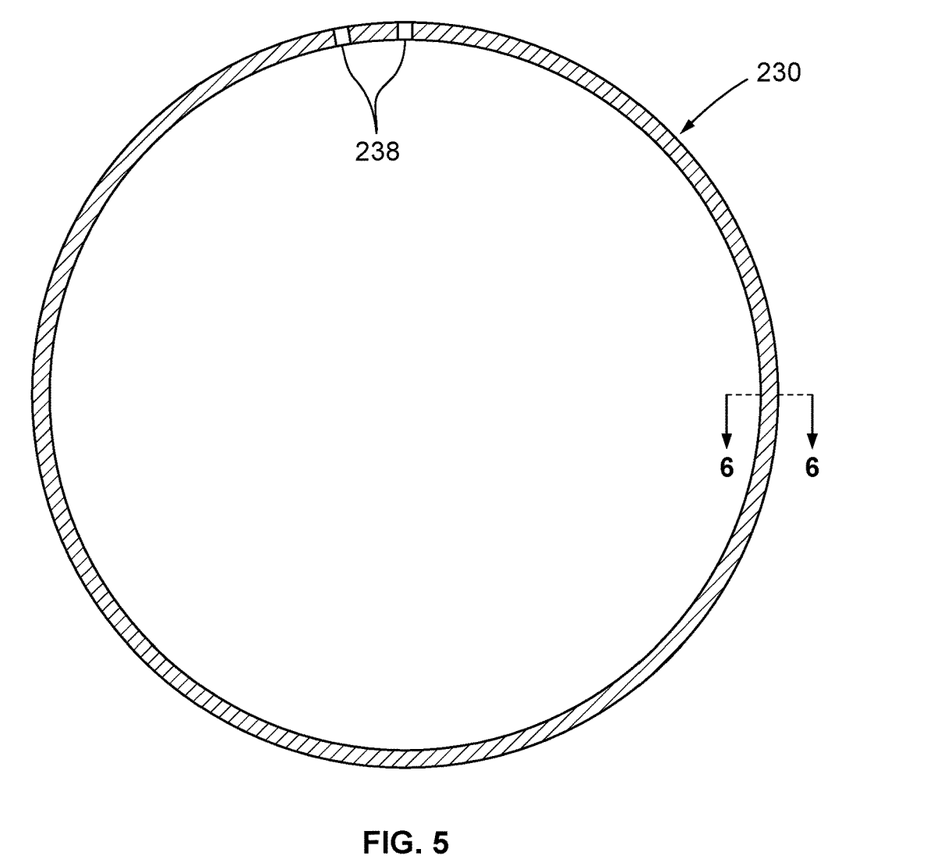
FIG. 5 is a cross sectional view of the weir of FIGS. 3-5 taken along line 5-5 of FIG. 4.
Figure 6:
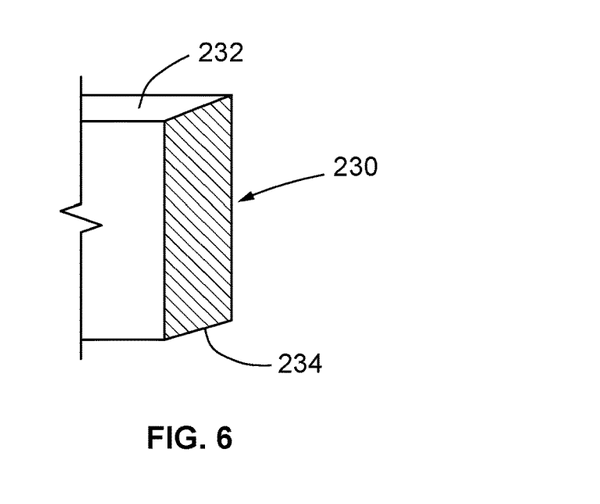
FIG. 6 is a cross sectional view of the weir of FIGS. 3-5 taken along line 6-6 of FIG. 5.
Figure 7:
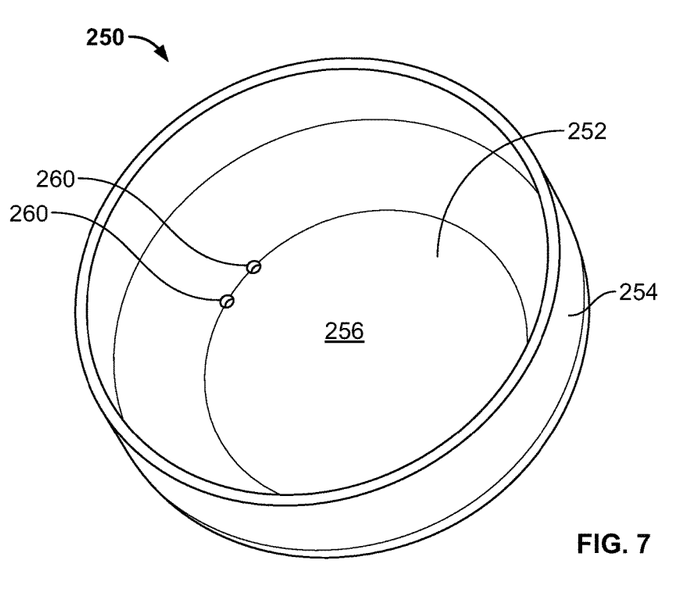
FIG. 7 is a top perspective view of a second crucible used in the crystal growing system of FIG. 1.
Figure 8:
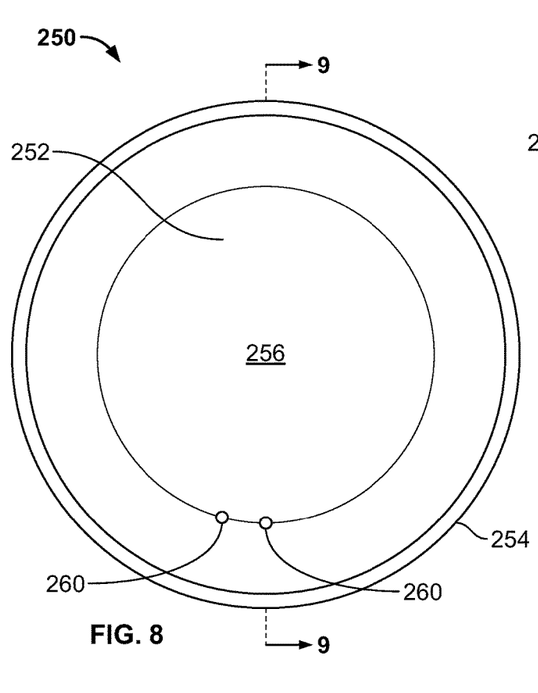
FIG. 8 is a top elevation of the second crucible of FIG. 7.
Figure 9:
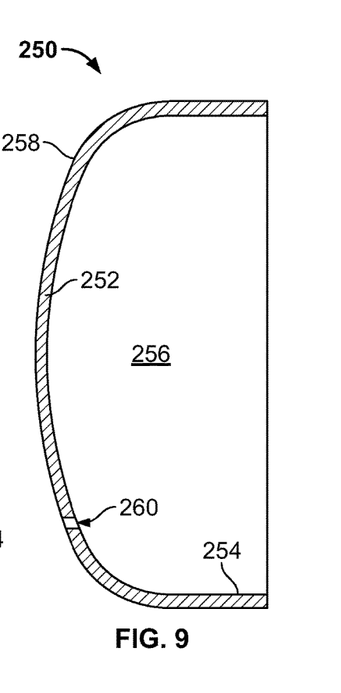
FIG. 9 is a cross sectional view of the weir of FIGS. 7-8 taken along line 9-9 of FIG. 8.

A crucible passageway 260 extends through the second crucible 250 to allow the melt to move into the inner cavity 256 of the second crucible. The crucible passageway 260 may be positioned along the second base 252 to increase the distance that the crucible passageway extends through. There may be any number of crucible passageways 260, though two are shown in FIGS. 3-5.

With additional reference to FIG. 3-6, the weir 230 is a tubular body with a top weir surface 232 and a bottom weir surface 234. The bottom weir surface 234 rests against the top surface 218 of first base 212. The bottom surface 258 of the second base 252 rests against the top weir surface 232. The top surface 218 and the bottom surface 258 are complementary to the bottom surface 234 of the weir 230 and the top surface 232 of the weir, respectively. These complementary surfaces form a barrier to inhibit melt 112 from passing between the weir 230 and either the first crucible 210 or the second crucible 250.

The weir 230 is located along the first base 212 at a location inward from the first sidewall 214 to inhibit movement of the melt 112 from a location outward of the weir to a location inward of the weir. The weir 230 may include at least one weir passageway 238 extending therethrough to allow melt in the outer cavity 216 to move inward of the weir into an intermediate cavity 236.

In this embodiment, the weir 230 is a 20-inch quartz cylinder that has a bottom surface 234 shaped to conform to the contact points of the first crucible 210, and a top surface 232 shaped to conform to the contact points of the second crucible 250. The weir 230 is fire polished. In this embodiment, the height of the weir 230 provides necessary clearance between the second crucible 250 and a heat reflector 150. Advantageously, use of a submerged weir provides a relatively large open inner melt surface area that reduces the oxygen level in the ingot. An evaporative oxygen removal subsystem that uses gas flow to remove oxygen may also be used to reduce the overall level of oxygen within the system.

In some embodiments, the weir is bonded to the first base. In other embodiments, the weir is bonded to the second base, while in others, the weir is bonded to both the first and second bases. The first crucible 210 and the second crucible 250 may be fire polished to improve the bond, e.g., the durability and reliability of the bond. However, there is little or no failure risk associated with the bond because the second crucible is a full crucible.

The amount of oxygen within the ingot is reduced in at least three ways. First, the depth of the silicon melt below the forming crystal ingot is reduced. As a result, the distance from the melt ingot interface to the bottom of the second crucible is decreased. The submerged weir supports the second crucible in spaced relation to the first crucible reducing this distance. Furthermore, the depth of the melt in the inner zone can be varied by changing the height of the submerged weir, effectively tuning the amount of oxygen incorporated into the ingot. Second, the surface area of the inner melt is increased by the use of a single quartz barrier above the melt. The location of the second crucible above the weir maximizes the free melt surface area reducing the oxygen content within the ingot. Third, the weir provides an additional layer of quartz below the crystal to insulate the inner melt zone, reducing the temperature of the inner quartz, reducing the quartz dissolution, reducing the oxygen in the melt, and ultimately reducing the amount of oxygen in the ingot.

An outer zone is formed in the outer cavity 216, between the first sidewall 214 and the weir 230. The use of a larger first crucible increases the volume of melt in the outer zone and allows for faster feeding of an intermediate zone, formed inward of the weir cavity 236, between the first base 212 and the second base 252. An inner zone is formed in the inner cavity, which is inward of the second crucible 250.

With further reference to FIG. 1, the crystal growing system 100 includes the heat reflector 160 adjacent the crucible assembly 200. The heat reflector 160 covers a portion of the inner cavity 256 and all of the outer cavity 216 to inhibit line-of-sight polysilicon projectiles from reaching the inner melt surface during the addition of the solid feedstock material 116 and prevent gas from the outer zone from entering the inner zone.

Solid feedstock material 116 may be placed into the outer zone from feeder 118 through feed tube 120. The feedstock material 116 is at a much lower temperature than the surrounding melt 112 and absorbs heat from the melt as the feedstock material's temperature rises, and as the solid feedstock material liquefies in the outer zone to form an outer melt portion. As the solid feedstock material 116 (sometimes referred to as "cold feedstock") absorbs energy from melt 112, the temperature of the surrounding melt falls proportionately to the energy absorbed.

The amount of feedstock material 116 added is controlled by feeder 118, which is responsive to activation signals from a controller 122. The amount of cooling of the melt 112 is precisely determined and controlled by controller 122. Controller 122 either adds or does not add feedstock material 116 to adjust the temperature and the mass of the melt 112. The addition of feedstock material 116 may be based on the mass of the silicon in the crucible, e.g., by measuring the weight or measuring liquid height of the melt.

As solid feedstock material 116 is added to melt 112, the surface of the melt may be disturbed. This disturbance also affects the ability of the silicon atoms of the melt 112 to properly align with the silicon atoms of the seed crystal 132. The weir 230 and second sidewall 254 inhibit inward propagation of the disturbances, as will be discussed below.

Heat is provided to crucible assembly 200 by heaters 124, 126, and 128 arranged at suitable positions about the crucible assembly. Heat from heaters 124, 126, and 128 initially melt the solid feedstock material 116 and then maintains melt 112 in a liquefied state. Heater 124 is generally cylindrical in shape and provides heat to the sides of the crucible assembly 200, and heaters 126 and 128 provide heat to the bottom of the crucible assembly. In some embodiments, heaters 126 and 128 are generally annular in shape.

Heaters 124, 126, and 128 are resistive heaters coupled to controller 122, which controllably applies electric current to the heaters to alter their temperature. A sensor 130, such as a pyrometer or like temperature sensor, provides a continuous measurement of the temperature of melt 112 at the crystal/melt interface of the growing single crystal ingot 114. Sensor 130 also may be directed to measure the temperature of the growing ingot. Sensor 130 is communicatively coupled with controller 122. Additional temperature sensors may be used to measure and provide temperature feedback to the controller with respect to points that are critical to the growing ingot. While a single communication lead is shown for clarity, one or more temperature sensor(s) may be linked to the controller by multiple leads or a wireless connection, such as by an infra-red data link or another suitable means.

The amount of current supplied to each of the heaters 124, 126, and 128 by controller 122 may be separately and independently chosen to optimize the thermal characteristics of melt 112. In some embodiments, one or more heaters may be disposed around the crucible to provide heat.

As discussed above, seed crystal 132 is attached to a portion of puller 134 located over melt 112. The puller 134 provides movement of seed crystal 132 in a direction perpendicular to the surface of melt 112 allowing the seed crystal to be lowered down toward or into the melt, and raised up or out of the melt. To produce a high quality ingot 114, the melt 112 in an area adjacent to seed crystal 132/ingot 114 must be maintained at a substantially constant temperature and surface disruptions must be minimized.

To limit the surface disturbances and temperature fluctuations in the area immediately adjacent to seed crystal 132/ingot 114, the weir 230 and second crucible 250 are placed in the outer cavity 216 of the first crucible 210. The weir 230 and second crucible 250 separate the melt 112 into the intermediate melt portion in the intermediate zone and the inner melt portion in the inner zone. The inner melt portion is inward of the second crucible 250 adjacent to the seed crystal 132/ingot 114.

Movement of melt 112 between the outer melt zone and intermediate melt zone is permitted through passageway 238 in the weir 230. The passageway 260 in the second crucible 250 limits movement of melt 112 between the intermediate melt and inner melt zones. As shown in FIG. 2, these passageways 238, 260 are in diametric opposition to one another.

The movement of melt 112 is substantially limited to the locations of the passageways 238, 260 along the bottom of the crucible assembly 200. As a result, any movement of melt 112 into the inner zone is at a directly opposite location to that of the top of the melt, where ingot 114 is being pulled. This confinement of the melt movement limits surface disruptions and temperature fluctuations along the top of the inner melt portion of the melt 112.

The passageways 238, 260 permit controlled movement of the melt 112 between the outer zone and the intermediate zone and the inner zone. Inhibiting or limiting the melt movement between the melt zones allows the feedstock material in the outer zone to heat to a temperature that is approximately equivalent to the temperature of the inner melt portion as the feedstock material passes into and through the intermediate zone.

Figure 10:
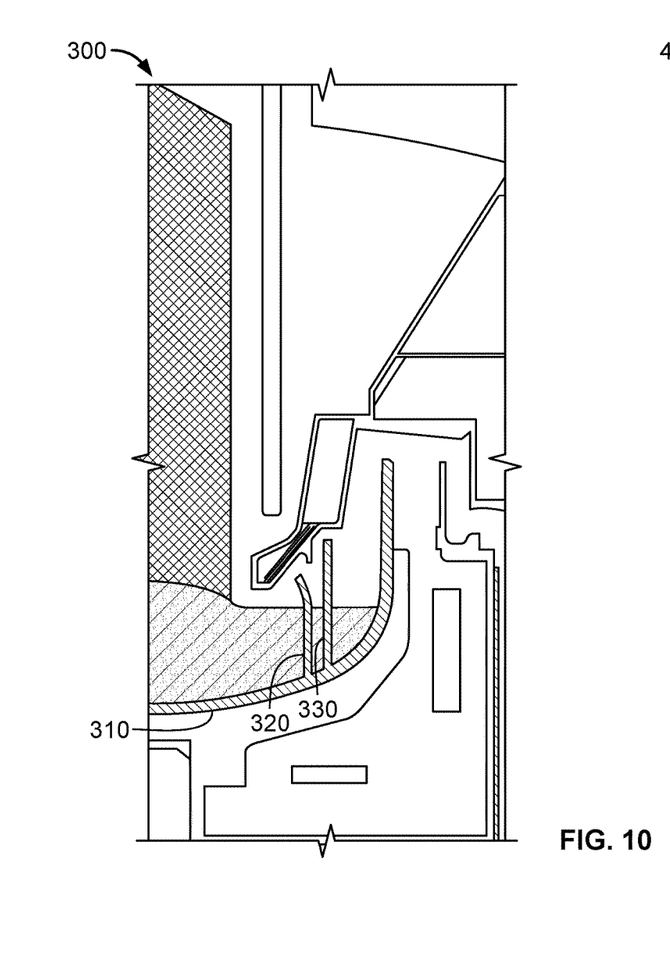
FIG. 10 is a partial cross sectional view of a traditional setup.
Figure 11:
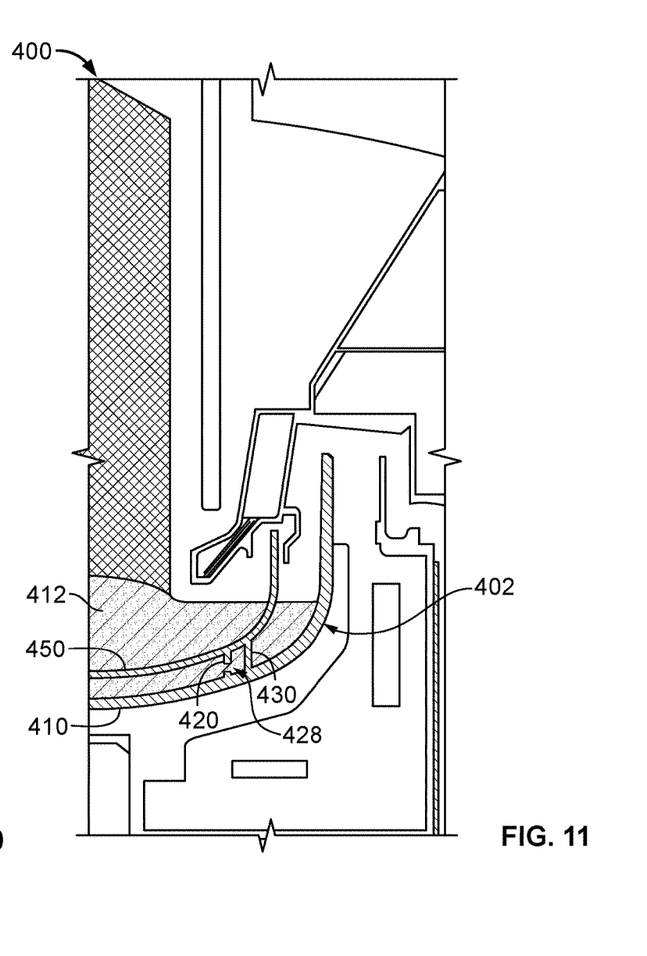
FIG. 11 is a partial cross-sectional view of a crystal growing system in accordance with another embodiment.

Referring to FIG. 10, a traditional crystal growing system 300 having a single crucible 310 and a pair of weirs 320, 330 is shown. With reference to FIG. 11, a crystal growing system 400 in accordance with another embodiment is shown for comparison with the traditional system of FIG. 10. A melt 412 is contained within a crucible assembly 400. To limit the surface disturbances and temperature fluctuations of the melt 412 in a center area of the crucible assembly 400, a first weir 420, and a second weir 430, and a second crucible 450 are placed within a first crucible 410 to separate the melt 412 into an outer zone, multiple intermediate melt zones, and an inner zone. The inner melt zone forms the center area that is inward of the second crucible 450.

The first and second weirs 420 and 430 are similar to weir 230 in that weirs 420 and 430 each have a cylindrical body with an open top and bottom. Weir 420 is substantially similar to weir 230. Weir 430 differs slightly from weir 230 in that the top and bottom are contoured to rest against the first crucible 410 and the second crucible 450 at a different location. As a result the top and bottom surfaces of weir 430 are contoured to compliment those locations, as shown in FIGS. 13-16. The bottom of each weir 420 and 430 are located adjacent to the inner surface of the first crucible 410. The second crucible 450 rests against the top of the weirs 420 and 430. Movement of the melt 412 is permitted through radial passageways 428 and 438 extending through each weir 420 and 430. In some embodiments, the passageways may be unaligned to form a tortuous path for the melt from an outer zone through the intermediate zones, and into the inner zone.

Movement of melt 412 between the various zones is limited to along the inner surface of the first crucible 410. Inhibiting the melt movement between the various zones allows silicon material in the outer zone to heat to a temperature that is approximately equivalent to the temperature of melt in the inner zone as the silicon material passes through the multiple intermediate zones.

Figure 12:
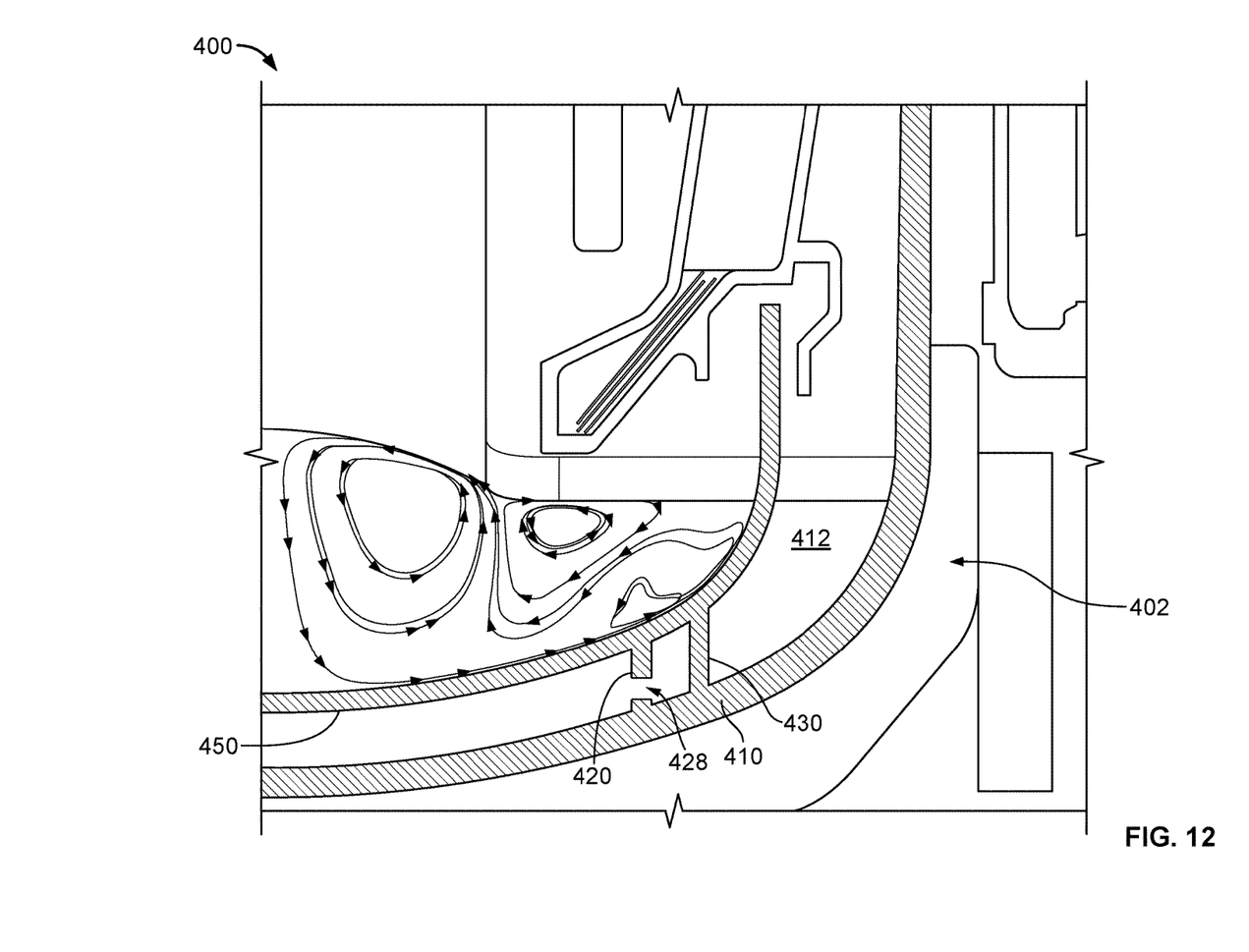
FIG. 12 is a partial cross sectional view of the crystal growing system of FIG. 15 illustrating the temperature field and streamlines of the melt.
Figure 13:
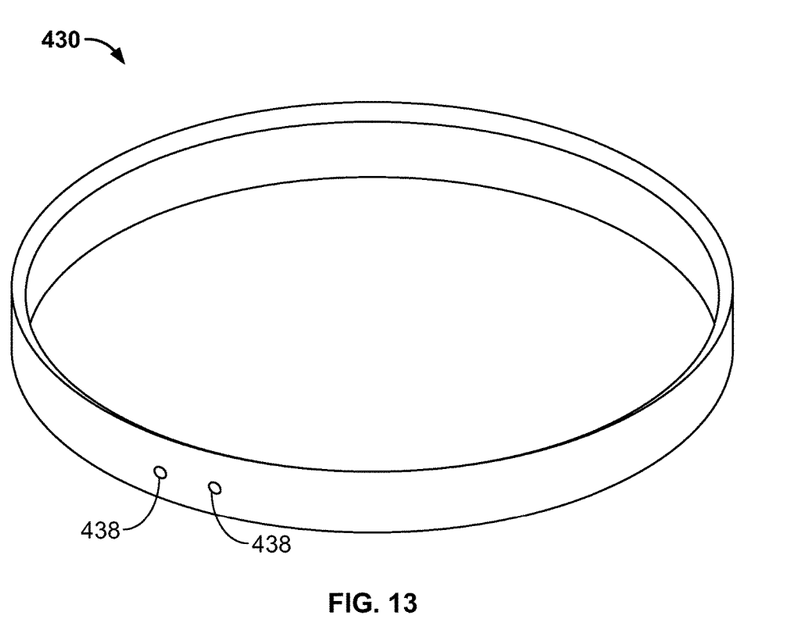
FIG. 13 is a top perspective view of a weir used in the crystal growing system of FIG. 10.
Figure 14:
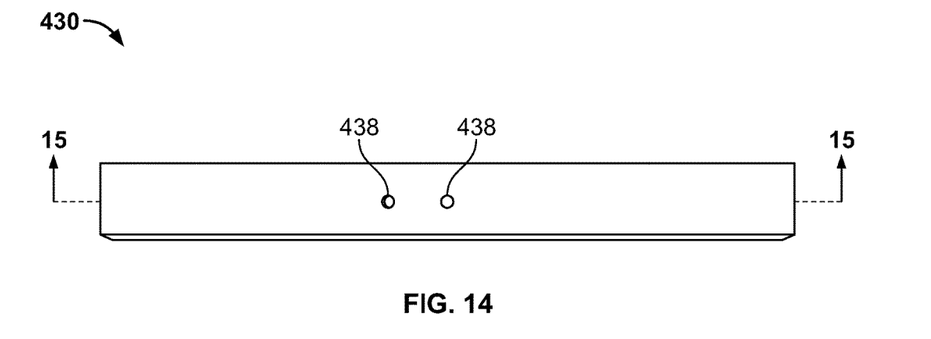
FIG. 14 is a side elevation of the weir of FIG. 13.
Figure 15:
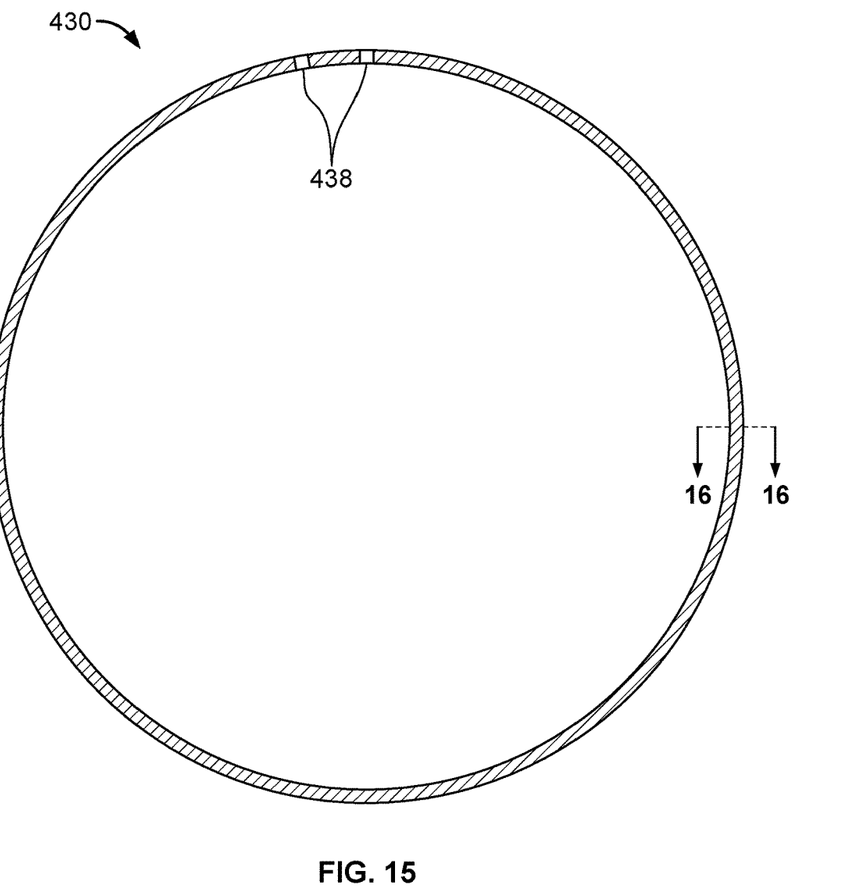
FIG. 15 is a cross sectional view of the weir of FIGS. 13-14 taken along line 15-15 of FIG. 14.
Figure 16:
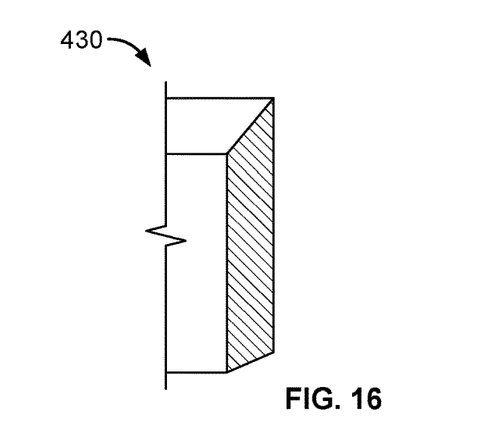
FIG. 16 is a cross sectional view of the weir of FIGS. 13-15 taken along line 16-16 of FIG. 15.

With specific reference to FIG. 12, streamlines and temperature fields of the melt in the inner zone during operation are shown for crystal growing system 400. The outer melt portion is cooler than either the intermediate or inner melt portion. Additional material is added to the outer melt portion during operation of the crystal growing system lowering the temperature of the outer melt portion. As discussed above, the additional material is cooler than the melt and therefore absorbs heat from the surrounding melt when added to the melt. Forcing the cooler melt material to move along the surface of the crucible adjacent to the heaters allow heat to be transferred into the cooler material before the cooler material enters the inner melt portion.

Figure 17:
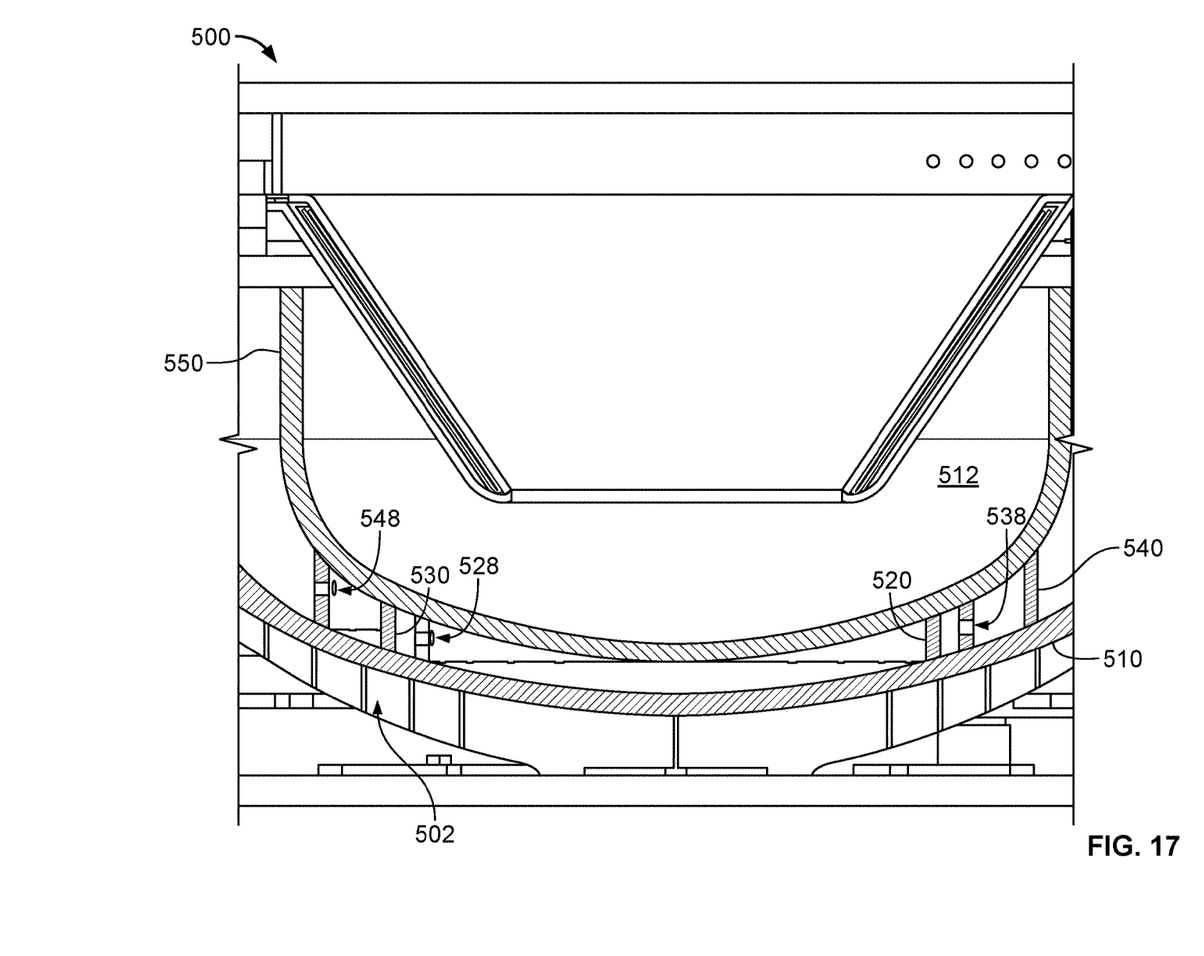
FIG. 17 is a partial cross sectional view of a crystal growing system in accordance with another embodiment.

Referring to FIG. 17, a crystal growing system 500 in accordance with another embodiment is shown. A melt 512 is contained within a crucible assembly 500. To limit the surface disturbances and temperature fluctuations of the melt 512 in a center area of the crucible assembly 500, a first weir 520, a second weir 530, a third weir 540, and a second crucible 550 are placed within a first crucible 510 to separate the melt 512 into an outer zone, multiple intermediate melt zones, and an inner zone. The inner melt zone forms the center area that is inward of the second crucible 550.

The first, second, and third weirs 520, 530, and 540 are similar to weir 230 in that weirs 520, 530, and 540 each have a cylindrical body with an open top and bottom. Weir 520 is substantially similar to weirs 230 and 420. Weir 530 is substantially similar to weir 430. Weir 540 differs from the other weirs in that the top and bottom of weir 540 are contoured to rest against the first crucible 510 and the second crucible 550 at a different location. As a result the top and bottom surfaces of weir 540 are contoured to compliment those locations. The bottom of each weir 520, 530, and 540 are located adjacent to the inner surface of the first crucible 510. The second crucible 550 rests against the top of the weirs 520, 530, and 540. Movement of the melt 512 maybe permitted through radial passageways 528, 538, and 548 extending through each weir 520, 530, and 540. In some embodiments the passageways 528, 538, and 548 may be unaligned to form a tortuous path for the melt from an outer zone through the intermediate zones, and into the inner zone.

Movement of melt 512 between the various zones is limited to along the bottom of the first crucible 510. Inhibiting the melt movement between the various zones allows silicon material in the outer zone to heat to a temperature that is approximately equivalent to the temperature of melt in the inner zone as the silicon material passes through the multiple intermediate zones.

In a method of one embodiment for growing a single crystal ingot 114 in a crucible assembly 200 having a first crucible 210, a weir 230, and a second crucible 250, solid feedstock material is placed in the first crucible.

Heaters 124, 126 and 128 are placed adjacent to the crucible assembly 200 to provide heat for liquefying or melting the feedstock material 116, forming a melt 112. Once liquefied, the melt 112 moves from the outer zone into the intermediate zone and then into the inner zone. The movement of the melt 112 between the various zones is limited to passageways 238, 260 through the weir 230 and the second crucible 230, respectively.

The seed crystal 132 is lowered into and then slowly raised out of the melt 112 to grow the ingot from the seed crystal. As the seed crystal 132 is slowly raised, silicon atoms from the melt 112 align with and attach to the silicon atoms of the seed crystal 132 allowing the ingot to grow larger and larger. The raising of the silicon atoms from the melt 112 causes them to cool and solidify.

In other embodiments, the weir does not include passageways. In these embodiments, movement of the melt from the outer zone into the intermediate zone is limited to movement above or below the weir.

Inhibiting movement of the melt between the zones substantially prevents un-liquefied feedstock material from passing into the inner zone and disturbing the structural integrity of the ingot being formed therefrom.

In addition, the temperature of the melt increases as the melt passes from the outer zone to the intermediate zone and then into the inner zone. By the time the melt reaches the inner zone, the melt is substantially equivalent in temperature to the melt already in the inner zone. Raising the temperature of the melt before reaching the inner zone reduces the temperature fields within the inner zone.

Further, inhibiting movement of the melt between the zones to through the passageways allows the surface of the inner zone to remain relatively undisturbed. The weir substantially prevents disturbances in the outer zone or intermediate zone from disrupting the surface of the melt in the inner zone by substantially containing the energy waves produced by the disturbances in the outer zone and intermediate zone. The disturbances are also inhibited by the location of the passageways. The passageways are located along the bottom of the second crucible and through weir to allow movement of the melt into the inner zone without disrupting the surface stability of the inner zone.

The temperature of the melt in the inner zone may suitably be measured at a location immediately adjacent the growing ingot by a sensor. The sensor is connected with the controller. The controller adjusts the temperature of the melt by supplying more or less current to the heaters and by supplying more or less feedstock material to the melt. The controller is also capable of simultaneously supplying feedstock material while the seed crystal is raised from the melt and growing the ingot.

EXAMPLE

A crystal growing system was constructed and operated according to the above method. An ingot from this process was compared to an ingot from the traditional crystal growing system of FIG. 10. With reference to Table 1 below, the ingot produced by the above method had a lower amount of oxygen incorporated into the crystal.

TABLE 1

Performance results of traditional vs internal crucible setup.

| | Traditional setup | Internal crucible supported on multiple weirs setup |
|---|---|---|
| Oi (ppma) (Amount of oxygen incorporated into the crystal) | 14.4 | 12.2 |
| Feed zone outer crucible wall net heat input (kW) | 6.9 | 8.1 |

Embodiments of this disclosure may reduce the amount of oxygen in the ingot, lower the consumption rates of the weir and second crucible providing a longer run life, and provide better system performance. A larger outer zone or feed region prevents icing in the outer feed region and allows higher growth rates of the ingot. The labyrinth flow provides enough time for the solid feedstock material to dissolve before reaching the growing ingot.

Another benefit is that the volume and liquid-quartz surface area of the outer zone increases. The increase in volume and liquid-quartz surface area of the outer zone enhances heat transfer to the zone increasing the rate that solid feedstock material is liquefied. The increase in the conversion rate is especially beneficial when the rate of adding solid feedstock material is high and a lot of energy needs to be supplied to the zone to continuously liquefy solid feedstock material.

The above embodiments provide improved impurity characteristics while reducing incidents of loss of crystal structure due to solid particles impacting the crystal. They also provide the advantage of having multiple weirs that separate the melt into multiple zones.

Additionally, use of the above embodiments significantly reduces the risk associated with structural bond failure by the use of a full interior crucible providing a leak-free separation between the inner zone and the intermediate zone neighboring it. The reductions in risk and improved efficiency not only increases the overall production of the crystal forming system, but also lowers overall operational costs.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the invention, it is intended that all matter contained in the above description and shown in the accompanying drawing[s] shall be interpreted as illustrative and not in a limiting sense.

What is claimed is:

1. A method for growing a crystal ingot from a melt in a crystal growing system, the system including a first crucible having a first base and a first sidewall extending upward from the first base, the first crucible defining an outer cavity inward of the first wall, the first base having a top surface, the method comprising:
    placing a weir along the top surface of the first base to inhibit movement of the melt from a location outward of the weir to a location inward of the weir;
    placing a second crucible within the outer cavity at a location on top of the weir, the second crucible having a second base and a second sidewall forming an outer cavity, the second base having a crucible passageway extending therethrough, the crucible passageway located inward of the weir, the weir forming an intermediate cavity inward of the weir and between the first crucible and the second crucible;
    bonding the weir to at least one of the first base of the crucible and second base of the second crucible continuously around a circumference of the weir;
    placing feedstock material into the outer cavity; and
    melting the feedstock material to form the melt to allow movement of the melt from the outer cavity inward of the intermediate cavity and into the inner cavity.

2. The method of claim 1, further comprising the steps of lowering a seed crystal into the melt and raising the seed crystal with a growing crystal ingot out of the melt.

3. The method of claim 2, wherein the raising of the seed crystal is performed simultaneously with placing the feedstock material into the outer cavity of the crucible.

4. The method of claim 1, further comprising the step of providing a pull system for lowering and raising a seed crystal into and out of the melt.

5. The method of claim 1, further comprising the step of placing a heater directly below the first crucible for supplying heat to the first crucible and the second crucible to maintain the melt therein.

6. The method of claim 1, further comprising the step of providing a feed tube, a sensor, and a controller, the feed tube disposed adjacent the first crucible for supplying a feedstock material to the first crucible at a location that is outward of the second crucible, the sensor configured to detect a height of the melt, the controller configured to control a flow of feedstock material through the feed tube based on the height of the melt.

7. The method of claim 1, wherein the weir is bonded to the first crucible around a circumference of the weir to form an assembled crucible having two sidewalls and a single base.

8. The method of claim 1, wherein the weir is bonded to the second base of the second crucible around a circumference of the weir.

9. The method of claim 1, wherein the weir has a weir passageway extending therethrough to allow the melt in the outer cavity of the first crucible to move within the weir.

10. The method of claim 9, wherein the weir passageway and the crucible passageway through the second crucible are in diametric opposition to one another to provide a tortuous path for the melt.

11. A method for growing a crystal ingot from a melt in a crystal growing system, the system including a first crucible having a first base and a first sidewall extending upward from the first base, the first crucible defining an outer cavity inward of the first wall, the method comprising:
    placing a weir within the outer cavity at a location along the first base to inhibit movement of the melt from a location outward of the weir to a location inward of the weir;
    placing a second crucible within the outer cavity at a location on top of the weir, the second crucible having a second base and a second sidewall forming an outer cavity, the second base having a crucible passageway extending therethrough, the crucible passageway located inward of the weir, the weir forming an intermediate cavity inward of the weir and between the first crucible and the second crucible;
    bonding the weir to at least one of the first base of the first crucible and the second base of the second crucible continuously around a circumference of the weir;
    placing feedstock material into the outer cavity; and
    melting the feedstock material to form the melt to allow movement of the melt from the outer cavity inward of the intermediate cavity and into the inner cavity.

12. The method of claim 11, further comprising the steps of lowering a seed crystal into the melt and raising the seed crystal with a growing crystal ingot out of the melt.

13. The method of claim 12, wherein the raising of the seed crystal is performed simultaneously with placing the feedstock material into the outer cavity of the crucible.

14. The method of claim 11, wherein the weir has a weir passageway extending therethrough to allow the melt in the outer cavity of the first crucible to move within the weir.

15. The method of claim 14, wherein the weir passageway and the crucible passageway through the second crucible are in diametric opposition to one another to provide a tortuous path for the melt.

16. The method of claim 15, further comprising the step of placing a second weir into the outer cavity at a location adjacent to the first base and second base.

17. The method of claim 16, wherein the second weir has a second weir passageway extending therethrough to allow the melt in the outer cavity of the first crucible to move within the second weir.

18. The method of claim 17, wherein the weir passageway and the second weir passageway through the second weir are in diametric opposition to one another to provide a tortuous path for the melt.

19. The method of claim 11, further comprising the step of providing a temperature sensor, a controller, and a plurality of heaters, the plurality of heaters disposed directly below the first crucible for supplying heat to the first crucible and the second crucible to maintain the melt therein, the temperature sensor configured to measure temperature, the controller configured to control each of the plurality of heaters independently.

20. The method of claim 11, further comprising the step of providing a feed tube, a sensor, and a controller, the feed tube disposed adjacent the first crucible for supplying a feedstock material to the first crucible at a location that is outward of the second crucible, the sensor configured to detect a weight of the melt, the controller configured to control a flow of feedstock material through the feed tube based on the weight of the melt.

* * * * *